(12) United States Patent
Khalil et al.

(10) Patent No.: US 9,692,450 B2
(45) Date of Patent: Jun. 27, 2017

(54) SYSTEMS AND METHODS FOR EARLY EXIT OF LAYERED LDPC DECODER

(71) Applicant: JMicron Technology Corporation, Irvine, CA (US)

(72) Inventors: Mohammad Athar Khalil, Irvine, CA (US); Shirley Xiaoling Fang, San Diego, CA (US); Jimmy Pu, Cerritos, CA (US)

(73) Assignee: Maxio Technology (Hangzhou) Ltd., Hangzhou (CN)

( * ) Notice: Subject to any disclaimer, the term of this patent is extended or adjusted under 35 U.S.C. 154(b) by 48 days.

(21) Appl. No.: 14/708,507

(22) Filed: May 11, 2015

(65) Prior Publication Data
US 2016/0336964 A1 Nov. 17, 2016

(51) Int. Cl.
*H03M 13/11* (2006.01)

(52) U.S. Cl.
CPC ........ *H03M 13/114* (2013.01); *H03M 13/116* (2013.01); *H03M 13/1128* (2013.01)

(58) Field of Classification Search
CPC . H03M 13/114; H03M 13/116; H03M 13/616
See application file for complete search history.

(56) References Cited

U.S. PATENT DOCUMENTS

| | | | |
|---|---|---|---|
| 7,296,216 B2 | 11/2007 | Shen et al. | |
| 7,760,880 B2 | 7/2010 | Dave et al. | |
| 8,171,367 B2 | 5/2012 | Gao et al. | |
| 8,291,285 B1 | 10/2012 | Varnica et al. | |
| 8,656,250 B2 | 2/2014 | Gunnam et al. | |
| 8,751,912 B1 * | 6/2014 | Varnica | H03M 13/036 714/785 |
| 8,756,479 B2 * | 6/2014 | Varnica | H03M 13/1108 714/752 |
| 9,136,877 B1 * | 9/2015 | Chen | |
| 2014/0298132 A1 * | 10/2014 | Wu | H03M 13/1108 714/758 |
| 2015/0106666 A1 | 4/2015 | Hubris et al. | |

FOREIGN PATENT DOCUMENTS

| | | |
|---|---|---|
| CN | 101416399 A | 4/2009 |
| CN | 100583651 C | 1/2010 |
| TW | 098146070 | 7/2011 |

* cited by examiner

*Primary Examiner* — April Y Blair
*Assistant Examiner* — Rong Tang
(74) *Attorney, Agent, or Firm* — Steven P. Chen; Hogan Lovells US LLP

(57) ABSTRACT

The present invention provides systems and methods to detect when hard decisions change for bit nodes of one or more layers of a layered LDPC decoder and to update accumulated partial syndrome calculations for those layers. As hard decisions of bit nodes are generated, they are compared with their previous values. If the hard decisions change, partial syndrome calculations are accumulated and updated for the layers having non-zero elements in one or more columns of the parity check matrix corresponding to the bit nodes of the changed hard decisions. If the hard decisions for the bit nodes are unchanged, the partial syndrome calculations for the corresponding layers are not updated. Changes to hard decisions of codewords are tracked and partial syndromes are flipped for the layers of the columns of the parity check matrix corresponding to the bit nodes of the changed hard decisions.

20 Claims, 12 Drawing Sheets

BLOCK DIAGRAM OF PARITY CHECK UNIT WITH MINIMAL EXIT DELAY

BLOCK DIAGRAM OF A LAYERED LDPC DECODER

ITERATIVE MESSAGE UPDATE AND PASSING PROCESS BASED ON A LDPC CODE BIPARTITE GRAPH

H MATRIX FOR THE BIPARTITE GRAPH OF FIG. 2

EXAMPLE OF AN IRREGULAR LDPC H MATRIX

BLOCK DIAGRAM OF PARITY CHECK UNIT WITH MINIMAL EXIT DELAY

BLOCK DIAGRAM OF PARITY CHECK UNIT WITH MINIMAL EXIT DELAY FOR A LAYERED QC-LDPC DECODER

ARCHITECTURE TO PERFORM QC MATRIX VECTOR MULTIPLICATION IN SYNDROME ACCUMULATOR

AN IMPLEMENTATION OF A SYNDROME ACCUMULATOR WITH THE NUMBER OF CYCLIC SHIFTERS EQUAL TO THE COLUMN WEIGHT OF H MATRIX

FLOW CHART OF THE FUNCTIONALITY OF SYNDROME ACCUMULATOR CONTROL

BLOCK DIAGRAM OF PARITY CHECK UNIT FOR PARTIAL SYNDROME ACCUMULATION OF MULTIPLE GROUPS OF HARD DECISIONS

BLOCK DIAGRAM OF PARITY CHECK UNIT TO SYNCHRONIZE SYNDROME CHECK AND DECODED DATA USING ADDITIONAL MEMORIES

FLOW CHART OF THE PROCESSING OF SYNDROME ACCUMULATOR CONTROL TO SYNCHRONIZE SYNDROME CHECK AND DECODED DATA

SYSTEMS AND METHODS FOR EARLY EXIT OF LAYERED LDPC DECODER

BACKGROUND OF THE INVENTION

1. Field of the Invention

The present invention relates to systems and methods for decoding data in communication or data storage systems. In particular, the present invention relates to systems and methods for early detection of a correctly decoded codeword from a layered low density parity check (LDPC) decoder.

2. Description of Related Art

In communication and data storage systems, information bearing signals received by receivers or controllers may be corrupted by noise, interference, or other types of disturbances. To improve the probability that the information is correctly reconstructed, error correction codes (ECC) are frequently used to introduce redundancy bits or parity bits in the data bearing the information. LDPC codes belong to a category of ECC called linear block codes. LDPC codes are characterized by parity check matrices that are very sparse, meaning a low density of non-zero elements. An LDPC decoder may iteratively determine the most likely information-bearing codeword corresponding to a received vector. LDPC decoding can be realized by sum-product or min-sum decoding algorithms or their variants. Irrespective of specific decoding algorithm, given an LDPC code defined by an m×n parity check matrix, LDPC decoding can be represented by an iterative message update and passing process between m check (or constraint) nodes in one set and n bit (or message) nodes in the other set. Different message update computation rules and/or different message passing (or exchange) scheduling strategies lead to different LDPC decoding algorithms. To verify a decoded codeword, the LDPC decoder may perform a matrix multiplication of a vector of hard decisions with the parity check matrix of the LDPC code in a parity check operation. A valid codeword is declared when the result of the matrix multiplication generates a zero vector. For example, in an LDPC code of block length n having (n−m) information bits and m parity bits (i.e., code rate is (n−m)/n), the parity check matrix may be an m×n binary matrix. Matrix multiplication of the m×n parity check matrix with n×1 hard decisions of a received vector generates m check nodes or parity nodes. In layered LDPC decoding, each row of the m×n parity check matrix is called a layer. Each layer has a check node, and the exclusive-or of all the hard decisions having elements of one in a layer of the matrix (i.e. bit nodes), generates the syndrome for that layer. The code word is correctly decoded when the syndromes for all the layers are zero.

In a conventional layered LDPC decoder, the generation of hard decisions may proceed in layers. The syndrome for a current layer may be updated when the hard decisions for the bit nodes of the layer are received. To update the syndromes for all the layers it may take m clock cycles for the layered LDPC decoder to run through all m layers. When the hard decision of any bit node changes during layered decoding, it may take another m clock cycles to verify that the syndromes for all the layers are zero. This approach increases decoding latency and decreases decoding throughput.

Furthermore, because a conventional layered LDPC decoder constantly updates the hard decisions, layered decoding may need to be halted during the parity check operation, which would degrade the decoding throughput even further. One way to avoid halting the decoding process during the parity check calculation is to have two sets of hard decision memories. Run-time parity check and hard decision updates may proceed in parallel by alternatively operating between the two memories. However, the extra copy of hard decision memory increases cost, area, and power consumption. There is also no guarantee that the parity check operation will terminate as soon as all the hard decisions are generated because the exit time may still depend upon when the correct decoded data enters the hard decision memory. In the worst case it may still take m clock cycles after the last hard decision is generated to finish the syndrome calculation and for the parity check operation to indicate the completion of decoding. As such, it is desirable to have a minimal, fixed exit delay from a run-time parity check of a layered LDPC decoder while minimizing any increase in cost, area, and power.

SUMMARY OF THE INVENTION

The present invention provides systems and methods to detect when hard decisions change for bit nodes of one or more layers of a layered LDPC decoder and to update accumulated partial syndrome calculations for those layers. As hard decisions of bit nodes are generated, they are compared with their previous values. If the hard decisions change, partial syndrome calculations are accumulated and updated for the layers having non-zero elements in one or more columns of the parity check matrix corresponding to the bit nodes of the changed hard decisions. If the hard decisions for the bit nodes are unchanged, the partial syndrome calculations for the corresponding layers are not updated. Because the number of non-zero elements in a column of an LDPC code, known as the column weight, is much less than the total number of layers, syndrome accumulations for the corresponding layers of the changed hard decisions may result in only a minimal increase in complexity.

In one or more embodiments, changes to hard decisions of codewords are tracked and partial syndromes are flipped for the layers of the columns of the parity check matrix corresponding to the bit nodes of the changed hard decisions. To increase decoder throughput, the parity check matrix may be partitioned to enable parallel generation of multiple groups of hard decisions. The syndrome accumulation technique of the present invention may be flexibly parallelized to accommodate parallel generation of hard decisions. The technique also inherently accommodates out of order processing of the hard decisions of code word in the parity check units. Because syndrome accumulations are updated for all the corresponding layers of the parity check matrix when the hard decisions of bit nodes change, exit time from the syndrome calculation may be fixed after the hard decisions of a valid codeword are generated. Thus, a minimal, fixed exit delay from a run-time parity check of a layered LDPC decoder is achieved with a minimal increase in cost, area, and power.

According to one embodiment of the present invention, a method for decoding an LDPC code is disclosed. The method includes receiving by a processor a sub-vector of a decoded codeword. The method also includes determining if the received sub-vector is different from a corresponding saved version of the sub-vector. If the received sub-vector is different from the saved version, the method further includes saving the received sub-vector as the saved version of the sub-vector for subsequent processing. The method further includes updating, based on the difference, partial syndromes of layers of the check nodes where the layers have non-zero elements in a column of the code matrix corresponding to the received sub-vector. The method further includes checking the partial syndromes of all layers of the check nodes.

According to one embodiment of the present invention, an apparatus for decoding an LDPC code is disclosed. The apparatus includes a memory unit that stores sub-vectors of a decoded codeword of the LDPC code. The apparatus also includes a partial syndrome accumulator that stores partial syndromes for layers of check nodes of the LDPC code. The apparatus further includes a control unit. The control unit receives a sub-vector of the codeword. The control unit also determines if the received sub-vector is different from the corresponding saved version of the sub-vector in the memory unit. If the received sub-vector is different from the saved version, the control unit further saves the received sub-vector in the memory unit. The control unit further updates, based on the difference, the partial syndromes of layers of the check nodes where the layers have non-zero elements in a column of the code matrix corresponding to the received sub-vector. The apparatus further includes a final syndrome check to check the partial syndromes of all layers of the check nodes in the partial syndrome accumulator.

BRIEF DESCRIPTION OF THE DRAWINGS

The accompanying drawings are provided together with the following description of the embodiments for a better comprehension of the present invention. The drawings and the embodiments are illustrative of the present invention, and are not intended to limit the scope of the present invention. It is understood that a person of ordinary skill in the art may modify the drawings to generate drawings of other embodiments that would still fall within the scope of the present invention.

DETAILED DESCRIPTION

The following paragraphs describe several embodiments of the present invention in conjunction with the accompanying drawings. It should be understood that the embodiments are used only to illustrate and describe the present invention, and are not to be interpreted as limiting the scope of the present invention.

The parity check matrix of an LDPC code is very sparse because the number of non-zero elements of the parity check matrix is low to simplify the hardware implementation. An LDPC parity check matrix may be written as:

$$H = \begin{bmatrix} H_{1,1} & H_{1,2} & \cdots & H_{1,n} \\ H_{2,1} & H_{2,2} & & H_{2,n} \\ \vdots & \vdots & \ddots & \vdots \\ H_{m,1} & H_{m,2} & \cdots & H_{m,n} \end{bmatrix} \quad \text{(Eq. 1)}$$

where $H_{i,j}$ may be a sub-matrix. If each sub-matrix $H_{i,j}$ is a circulant matrix in which each row of $H_{i,j}$ is a cyclic shift of the row above, the LDPC code is called a quasi-cyclic LDPC (QC-LDPC) code. QC-LDPC codes are a class of LDPC codes that have inherent structural regularity and can significantly simplify the hardware implementation. In addition, QC-LDPC codes can achieve very strong error correction strength with sufficiently low error floor. Let the size of each circulant matrix $H_{i,j}$ be p×p, then the parity check matrix H is a (m·p)×(n·p) binary matrix. Such a matrix defines an LDPC code that protects (n−m)·p bits of data with m·p parity bits, leading to a codeword length of n·p bits. Its code rate is thus (n−m)/n. For any valid LDPC codeword vector $\hat{v}$, we have $H \cdot \hat{v} = 0$.

$$\begin{bmatrix} H_{1,1} & H_{1,2} & \cdots & H_{1,n} \\ H_{2,1} & H_{2,2} & & H_{2,n} \\ \vdots & \vdots & \ddots & \vdots \\ H_{m,1} & H_{m,2} & \cdots & H_{m,n} \end{bmatrix} \begin{bmatrix} v_1 \\ v_2 \\ \vdots \\ v_n \end{bmatrix} = \begin{bmatrix} 0 \\ 0 \\ \vdots \\ 0 \end{bmatrix} \quad \text{(Eq. 2)}$$

where $v_i$ is a p-bit sub-vector and codeword vector $\hat{v}$ is a block code of (n·p) bits in length. The (m·p) rows of the H matrix are the (m·p) parity check equations. Each parity check equation is a modulo 2 addition of the hard decisions of the codeword vector $\hat{v}$ having a 1 in the corresponding column positions of the $[H_{i,1} H_{i,2} \ldots H_{i,n}]$ row vector. Because the number of 1s in the row vectors of H is low, hardware implementation of the parity check equations may be simplified. The discussion that follows uses a binary matrix H as an example. However, the technique disclosed may also be applied to non-binary parity check matrices.

Figure 1:
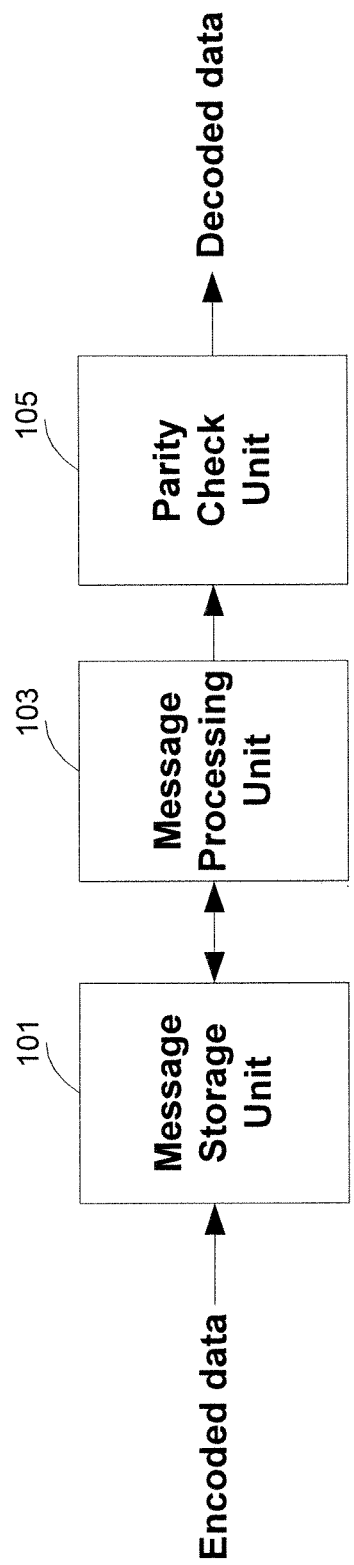
FIG. 1 shows a block diagram of a layered LDPC decoder according to one embodiment of the present invention.

FIG. 1 shows a block diagram of a layered LDPC decoder according to one embodiment of the present invention. A layered LDPC decoder treats each row of the parity check matrix as a layer. Layered decoding algorithm has a faster decoding convergence speed compared to other widely known decoding algorithms (i.e., it needs fewer decoding iterations for successful decoding compared to other widely known algorithms).

LDPC encoded data from a transmitter or data storage device are received by a message storage unit 101. The message storage unit 101 may be a memory buffer that stores a block code of (n·p) bits in length for decoding the encoded data. Message storage unit 101 may also store the bit-to-check and check-to-bit messages of an iterative message update and passing process. Message processing unit 103 processes the block code from message storage unit 101 to estimate the code bits of the original codeword. Message processing unit 103 may estimate the most likely codeword in the iterative message update and passing process using the parity check equations of the H matrix. Message processing unit 103 may incrementally generate hard decisions for the (n·p) code bits by progressing through the layers of the H matrix. As the estimates for the code bits are iteratively refined, the hard decisions may change.

Figure 2:
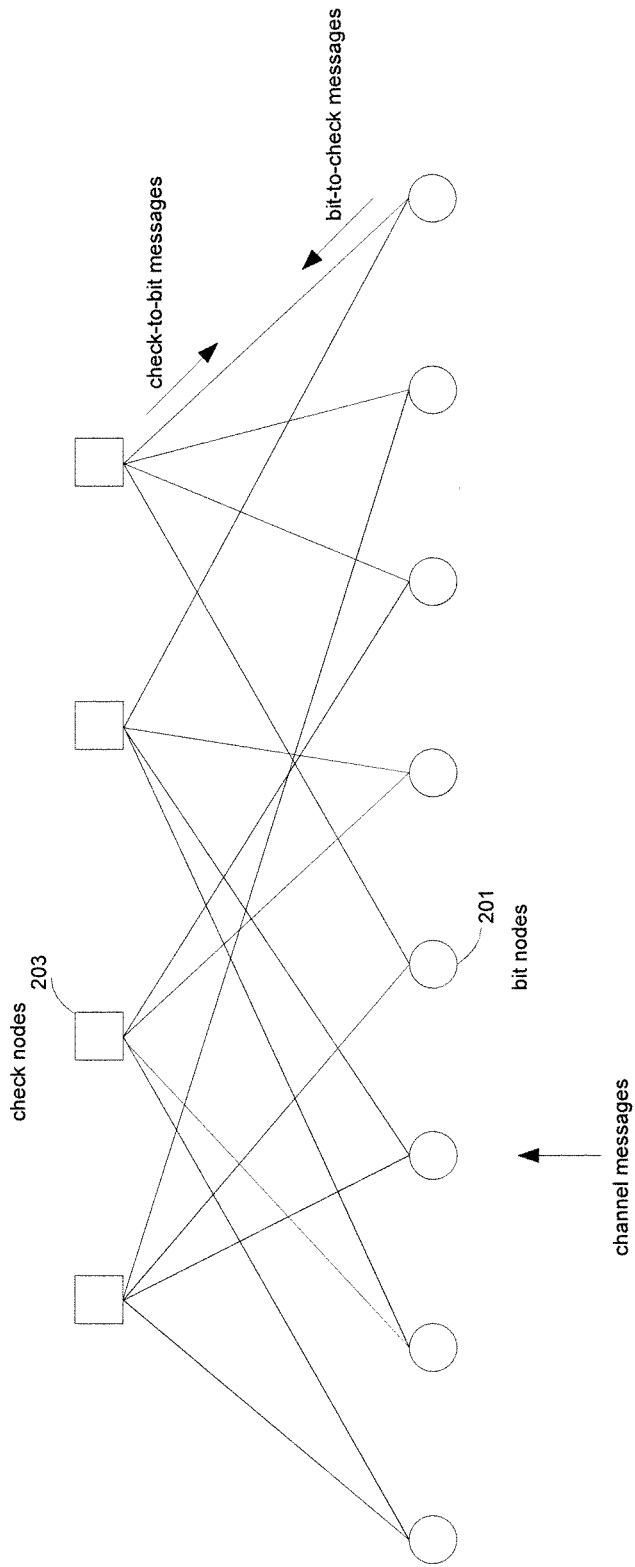
FIG. 2 shows an example of an LDPC code bipartite graph.
Figure 3:
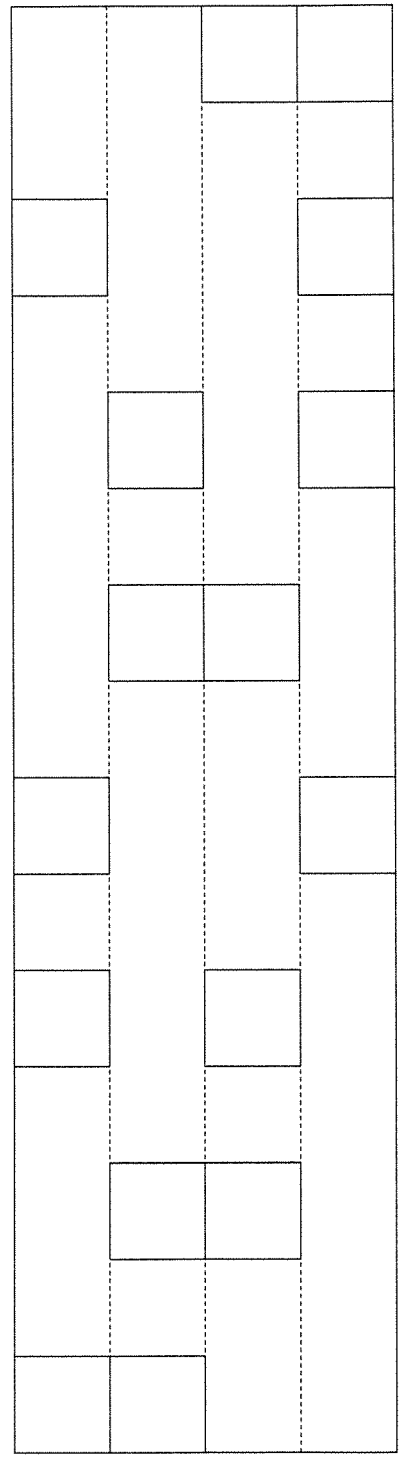
FIG. 3 shows a 4×8 H matrix corresponding to the bipartite graph in FIG. 2.

An LDPC code defined by an m×n parity check matrix may be represented by a bipartite graph between the m check nodes and the n bit nodes. The iterative message update and passing LDPC decoding process of message processing unit 103 may use the code bipartite graph. FIG. 2 shows an example of an LDPC code bipartite graph. FIG. 3 shows the 4×8 H matrix corresponding to the bipartite graph in FIG. 2. Referring back to FIG. 2, the LDPC code bipartite graph shows the connection between the 8 bit nodes 201 and the 4 check nodes 203 of the 4×8 H matrix. After bit nodes 201 are initialized with the channel messages, the estimates for the original codeword are iteratively computed by bit nodes 201 and check nodes 203 through messages that are exchanged through the connections between the nodes. As the estimates are refined, hard decisions for the codeword may be generated.

Referring back to FIG. 1, parity check unit 105 performs run-time parity check based on the current hard decisions obtained from message processing unit 103. Parity check unit 105 performs a sparse matrix-vector multiplication to check if the parity check equations are satisfied, i.e., $H \cdot \hat{v}=0$. Each row or layer of the H matrix is a check node, and the xor of hard decisions with all the non-zero circulants in a row generates the syndrome for that layer (syndrome equals to the modulo two addition of $[H_{i,1}\ H_{i,2}\ \ldots\ H_{i,n}] \cdot \hat{v}$). If the syndrome of all the layers is zero, the decoded data is error free, the decoding of the codeword is complete, and the iterative decoding process can be terminated. The number of layers in a corresponding column of the H matrix used with a hard decision in syndrome calculations (number of non-zero elements in a column) is the column weight of that column.

Figure 4:
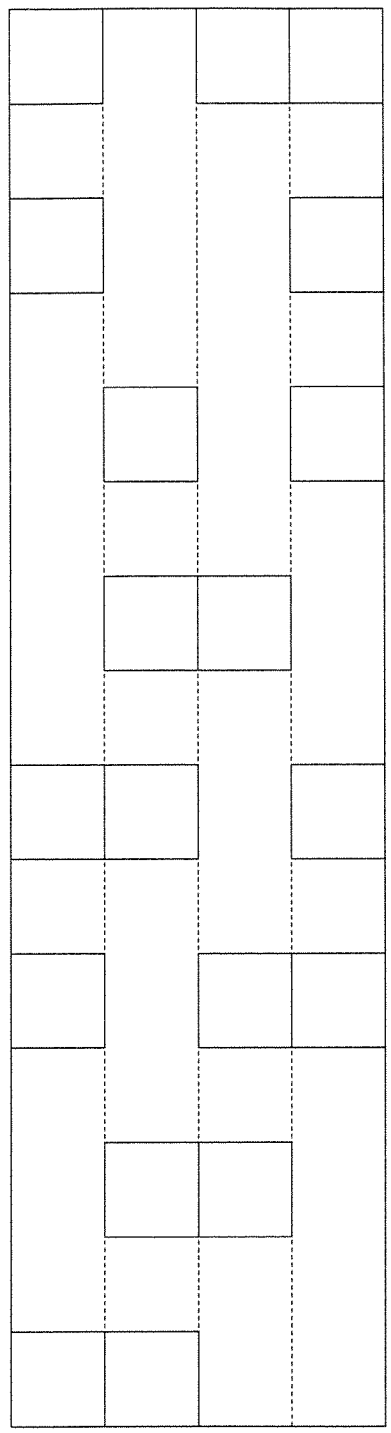
FIG. 4 shows an example of an irregular LDPC parity check matrix.

An LDPC code is called regular if the column weight (number of non-zero entries in a column) $w_c$ is constant for every column and row weight (number of non-zero entries in a row) $w_r$ is also constant for every row. The 4×8 H matrix in FIG. 3 is an example of a regular LDPC parity check matrix. Each box of the LDPC parity check matrix represents a non-zero circulant. In FIG. 3, $w_r=4$, $w_c=2$. In one or more embodiments, $w_r=w_c \cdot (n/m)$. If the parity check matrix is low density but the numbers of 1s in each row or in each column are not constant, the code is called an irregular LDPC code. FIG. 4 shows an example of an irregular LDPC parity check matrix.

Figure 5:
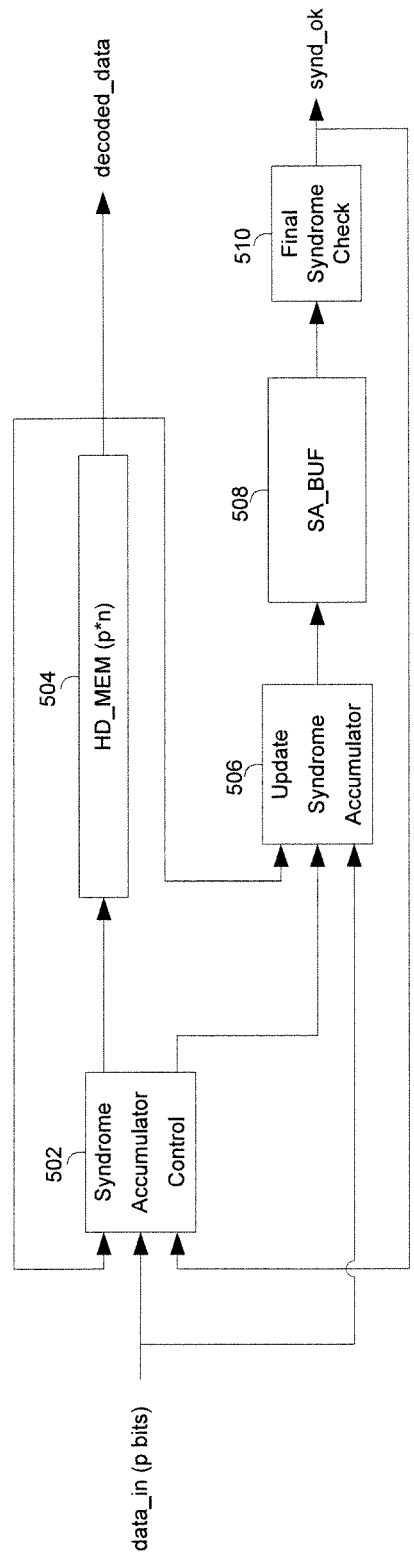
FIG. 5 shows a block diagram of a parity check unit with minimal exit delay for an LDPC decoder according to one embodiment of the present invention.

FIG. 5 shows a block diagram of a parity check unit with minimal exit delay for an LDPC decoder according to one embodiment of the present invention. A syndrome accumulator control module 502 controls the operation of syndrome calculation, update, and accumulation. Syndrome accumulator control module 502 receives data_in from message processing unit 103 of FIG. 1. Message processing unit 103 may operate on the parity check matrix by layers to iteratively generate the data_in as hard decisions for p bits of the decoded codeword. If the codeword is a QC-LDPC code, p may be the size of the circulant of the sub-matrix of the QC-LDPC parity check matrix.

Syndrome accumulator control module 502 determines if the p hard decisions of the codeword on data_in are the first time these p hard decisions are received. If the p hard decisions are received for the first time (e.g., at the beginning of the codeword decoding process), data_in is written into the appropriate location of a hard decision memory HD_MEM 504 and the syndromes associated with the p hard decisions are accumulated in a syndrome accumulator buffer SA_BUF 508. HD_MEM 504 may be (n·p) deep to store the (n·p) hard decisions of the decoded codeword. In one or more embodiments, if data_in represents the hard decisions for the first p code bits of the codeword decoded at the beginning of the decoding process, data_in may be written to the first p locations of HD_MEM 504.

In addition, an update syndrome accumulator 506 calculates the partial syndromes for the layers in the column of the parity check matrix corresponding to the p code bits. That is, for each non-zero circulant in the column of the QC-LDPC H matrix corresponding to the p hard decisions, a matrix multiplication of the non-zero circulant sub-matrix p×p with the p hard decisions may be performed. In the above example of data_in that represents the hard decisions for the first p code bits of the codeword, the corresponding column is the first column of the parity check matrix. The first column of the QC-LDPC H matrix may have a column weight $w_c$ of three. Thus, three non-zero p×p circulants are multiplied with the p hard decisions to generate 3×p partial syndromes for the three corresponding layers. The partial syndromes are stored in SA_BUF 508. The partial syndrome for a layer may be accumulated by the xor of SA_BUF 508 with the multiplication of the p hard decision with the p×p circulant sub-matrix for that layer. In one or more embodiments, SA_BUF 508 may be (m·p) deep to store the (m·p) partial syndromes.

If syndrome accumulator control module 502 determines that the p hard decisions of the codeword on data_in have previously been received by the parity check unit (e.g., data_in is an update of previously received p hard decisions from the iterative decoding process), syndrome accumulator control module 502 may compare the new p hard decisions on data_in with the existing p hard decisions stored in HD_MEM 504. If the hard decisions do not match, data_in is written to HD_MEM 504 to update the existing p hard decisions. The associated syndromes are also updated based on the difference and accumulated in SA_BUF 508. For example, if data_in represents the new hard decisions for the first p code bits of the codeword, data_in may be compared against the existing p hard decisions in the first p locations of HD_MEM 504. If the hard decisions do not match, indicating that one or more of the decoded p code bits have flipped, data_in may be written to the first p locations of HD_MEM 504 to overwrite the existing p hard decisions. Update syndrome accumulator 506 may calculate the change in the partial syndromes for the layers in the column of the parity check matrix corresponding to the changed hard decisions and may update SA_BUF 508 to reflect the updated partial syndromes.

If the new p hard decisions on data_in match with the existing p hard decisions stored in HD_MEM 504, no update to HD_MEM 504 or to SA_BUF 508 is required because there are no changes to the existing p hard decisions and thus no changes to the partial syndromes for the corresponding layers in the column of the parity check matrix. Because data_in may represent hard decisions for different p code bits of the codeword, the partial syndromes for different data_in may involve matrix multiplication of the p hard decisions with the circulants in different columns of the parity check matrix. Thus, different p hard decisions on data_in may update partial syndromes for different layers. The partial syndromes for the $w_c$ layers of the column associated with the current data_in are accumulated with the partial syndromes for these layers stored in SA_BUF 508. A final syndrome check module 510 monitors the partial syndromes in SA_BUF 508. After the hard decisions for all (n·p) code bits of the codeword have been received at least once, final syndrome check module 510 determines if the (m·p) partial syndromes in SA_BUF 508 are all zero. If they are, decoding is complete and the decoded data is output from HD_MEM 504. The parity check unit may reset SA_BUF 508 to prepare SA_BUF 508 to receive the next (n·p) bits of codeword.

As discussed, each sub-matrix $H_{i,j}$ of a QC-LDPC parity check matrix may be a p×p circulant sub-matrix in which each row $H_{i,j}$ of is a cyclic shift of the row above. An example of a 4×4 circulant matrix is:

$$\begin{bmatrix} 0 & 1 & 0 & 0 \\ 0 & 0 & 1 & 0 \\ 0 & 0 & 0 & 1 \\ 1 & 0 & 0 & 0 \end{bmatrix} \quad \text{(Eq. 3)}$$

The QC-LDPC parity check matrix is a sparse matrix in which the column weight $w_c$ of each circulant is either 1 or 0. Multiplication between a weight-1 circulant and a codeword sub-vector may then be reduced to a cyclic shift of the sub-vector:

$$\begin{bmatrix} 0 & 1 & 0 & 0 \\ 0 & 0 & 1 & 0 \\ 0 & 0 & 0 & 1 \\ 1 & 0 & 0 & 0 \end{bmatrix} \begin{bmatrix} u_1 \\ u_2 \\ u_3 \\ u_4 \end{bmatrix} = \begin{bmatrix} u_2 \\ u_3 \\ u_4 \\ u_1 \end{bmatrix} \quad \text{(Eq. 4)}$$

If a QC-LDPC parity check matrix H is a (t·p)×(c·p) matrix and the codeword vector u has c p-bit sub-vector $u_1$ to $u_c$, the result of parity check equations y are the matrix multiplication of H and u:

$$\begin{bmatrix} y_1 \\ y_2 \\ \vdots \\ y_t \end{bmatrix} = \begin{bmatrix} H_{1,1} & H_{1,2} & \dots & H_{1,c} \\ H_{2,1} & H_{2,2} & & H_{2,c} \\ \vdots & \vdots & \ddots & \vdots \\ H_{t,1} & H_{t,2} & \dots & H_{t,c} \end{bmatrix} \begin{bmatrix} u_1 \\ u_2 \\ \vdots \\ u_c \end{bmatrix} \quad \text{(Eq. 5)}$$

where each parity check node sub-vector $y_i$ is:

$$y_i = \Sigma_{j=1}^{c} H_{i,j} \cdot u_j \quad \text{(Eq. 6)}$$

where each product $H_{i,j} \cdot u_j$ is either a cyclic shift of $u_j$ or an all-zero vector. Therefore, as the hard decisions for the p-bit sub-vector $u_j$ are received by the parity check unit, the partial syndrome for $y_i$ is computed and accumulated for the layers having non-zero circulants in the column $H_{i,j}$ for $1 \leq i \leq t$.

Figure 6:
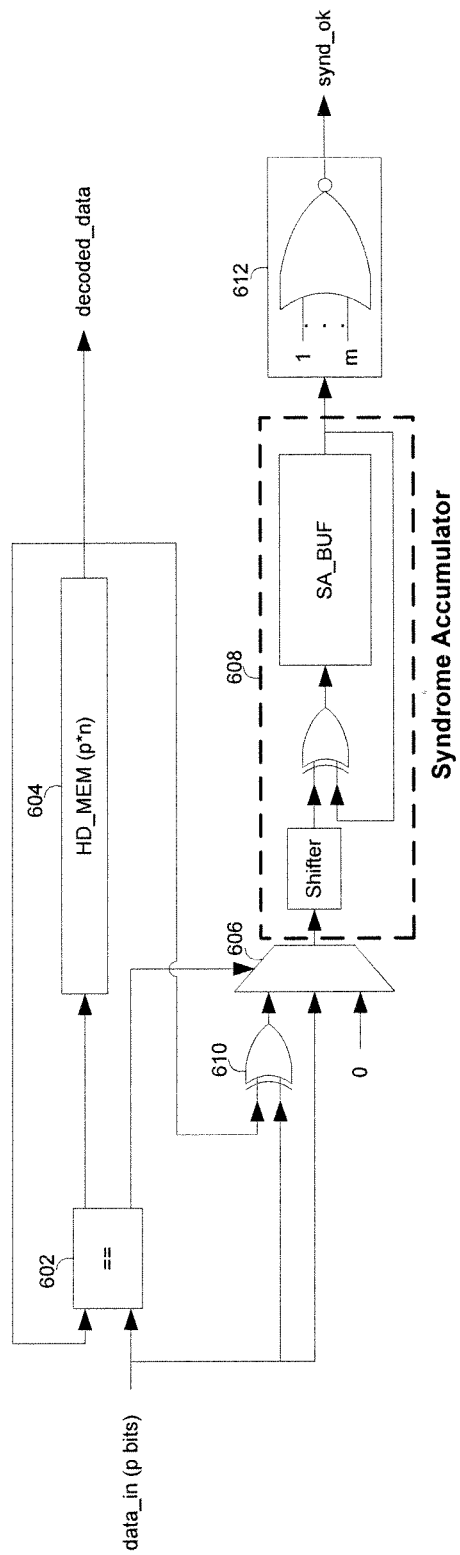
FIG. 6 shows a block diagram of a parity check unit with minimal exit delay for a layered QC-LDPC decoder according to one embodiment of the present invention.

FIG. 6 shows a block diagram of a parity check unit with minimal exit delay for a layered QC-LDPC decoder according to one embodiment of the present invention. The parity check unit receives data_in as hard decisions for the p-bit sub-vector $u_j$ of the decoded codeword from message processing unit 103 of FIG. 1. Data_in may be $u_j$ in the order of $u_1, u_2 \dots u_c$, or may be in other order. A comparator module 602 determines if $u_j$ in data_in is the first time that the hard decisions for $u_j$ is received. If it is, such as at the beginning of the codeword decoding process, data_in is written into a HD_MEM 604 and the partial syndromes for the layers in the column of the parity check matrix corresponding to $u_j$ are written into SA_BUF of a syndrome accumulator 608. HD_MEM 604 may be (n·p) deep to store the (n·p) hard decisions of the codeword; SA_BUF may be (m·p) deep to store the partial syndromes $y_i$ for the (m·p) layers.

Figure 7:
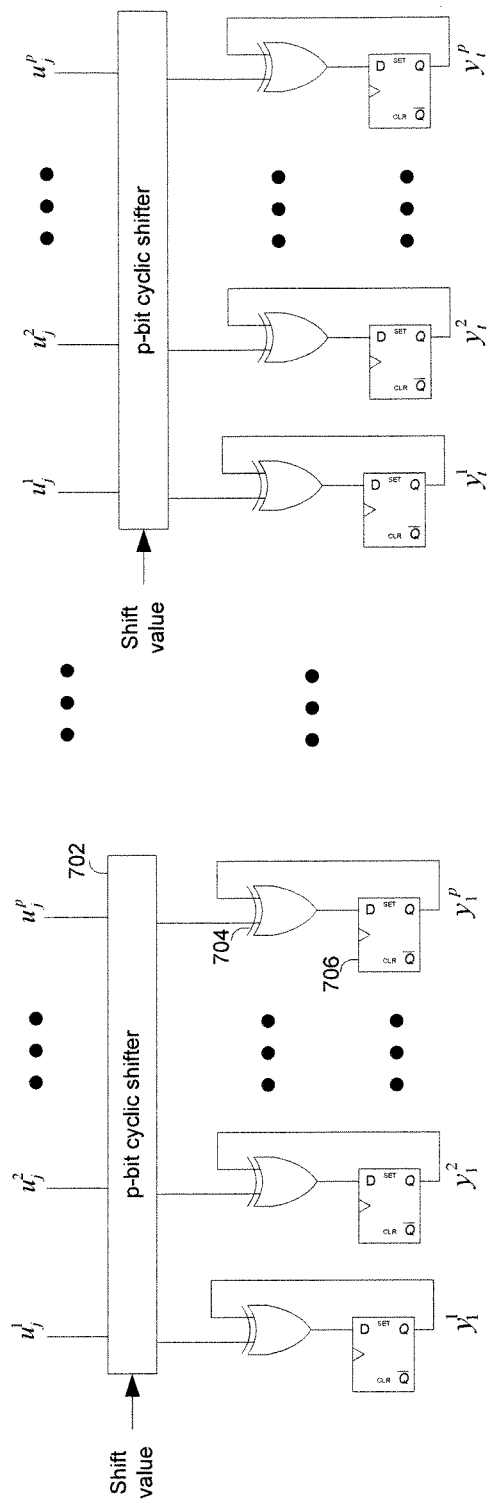
FIG. 7 shows a block diagram of a syndrome accumulator to perform matrix multiplication of circulants of a QC-LDPC parity check matrix with a sub-vector of hard decisions according to one embodiment of the present invention.

As multiplications between circulants in the column of a QC-LDPC parity check matrix and $u_j$ may be reduced to cyclic shifts of $u_j$, syndrome accumulator 608 may be implemented by a cyclic shifter followed by an accumulator. FIG. 7 shows a block diagram of a syndrome accumulator to perform matrix multiplication of circulants of a QC-LDPC parity check matrix with a sub-vector $u_j$ according to one embodiment of the present invention. A p-bit cyclic shifter 702 cyclically shifts the p hard decisions of $u_j$, represented by $u_j^1, u_j^2 \dots u_j^p$, by an amount as determined by the p×p circulant sub-matrix. The number of p-bit cyclic shifter 702 may equal the column weight $w_c$ to allow the syndrome calculation for the $w_c$ layers to proceed in parallel. For different $u_j$, the layers of the column of the parity check matrix corresponding to the $u_j$ may be different. Therefore, for different $u_j$, the output of the $w_c$ shifters are accumulated with a different set of partial syndromes from SA_BUF. In one or more embodiments, the number of p-bit cyclic shifter 702 may be the number of layers m. In these embodiments, only $w_c$ of the m p-bit cyclic shifters are active for each $u_j$, albeit a different set of $w_c$ shifters are active for different $u_j$.

The p-bit output of p-bit cyclic shifter 702 for a layer is modulo-2 summed with the corresponding p-bit partial syndrome $y_i$ stored in SA_BUF. The modulo-2 sum may be implemented by XOR gates 704. The SA_BUF may be implemented as flip-flops 706. There may be (m·p) flip-flops for the (m·p) layers. In one or more embodiments, SA_BUF may be implemented using single-port memories. Because a single-port memory allows access of only one memory location at a time, for the $w_c$ p-bit partial syndromes $y_i$, there may be $w_c$ single-port memories. Each single-port memory may have m locations and each location may be p bits wide for each p-bit partial syndrome $y_i$. For different $u_j$, the $w_c$ single-port memories may accumulate partial syndromes for a different set of $w_c$ partial syndromes $y_i$ because of the different corresponding layers of the parity check matrix. The partial syndromes for $y_i$ may thus be distributed across all $w_c$ single-port memories. To generate a final syndrome for $y_i$, the partial syndromes for $y_i$ across the $w_c$ single-port memories may have to be summed. In one or more embodiments, to simplify the implementation, the SA_BUF may be implemented as m of the (m·p) single-port memories even though only $w_c$ of these single-port memories are active for a given $u_j$.

Returning to FIG. 6, if comparator module 602 determines that the $u_j$ in data_in has previously been processed by the parity check matrix (e.g., $u_j$ are updated hard decisions from the iterative decoding process), comparator module 602 may compare the new $u_j$ with the existing $u_j$ stored in HD_MEM 604. If the hard decisions match, there is no update to HD_MEM 604. Zero will be selected through a multiplexor 606 for syndrome accumulator 608 and the SA_BUF will also not be updated. If the hard decisions do not match, the data_in is written into HD_MEM 604. An XOR gate 610 generates the difference between data_in and the corresponding hard decisions of HD_MEM 604 to detect which of the p bits of data_in have flipped. Comparator module 602 selects the flipped bits of data_in through multiplexor 606 for syndrome update. Syndrome accumulator 608 cyclically shifts the flipped bits of data_in to flip the partial syndromes for the layers of the column of the parity check matrix corresponding to the flipped bits. The updated partial syndromes are written into the SA_BUF of syndrome accumulator 608. Thus, when one or more hard decisions of bit nodes in $u_j$ flip from the iterative decoding process, the partial syndromes for the check nodes affected by the flipped hard decisions may also flip.

A final syndrome check module 612 monitors the partial syndromes in SA_BUF for all layers. After the hard decisions for all $u_j$ in $u_1, u_2 \ldots u_c$, have been received at least once, final syndrome check module 612 determines if the partial syndromes for all the layers are zero. If they are all zero, a synd_ok flag is raised to indicate a valid codeword has been detected. The valid codeword is output by HD_MEM 604 and the decoding is terminated. Final syndrome check module 612 may be implemented as an m-input NOR gate, where m is the number of layers or rows of the parity check matrix. In the example of the QC-LDDC code with (m·p) layers, m may become (m·p). After decoding for the current codeword is terminated, zero may be selected through multiplexor 606 to reset the SA_BUF for accumulating afresh the partial syndromes of the next codeword. Because the partial syndromes are accumulated in parallel for all the layers of the parity check matrix corresponding to the flipped code bits, the exit time to terminate the decoding is fixed from the time the valid codeword enters the parity check unit.

As discussed, to reduce the size of the syndrome accumulator, the number of p-bit cyclic shifters may equal to the column weight $w_c$ of the parity check matrix. The layers of the parity check matrix having non-zero p×p circulant sub-matrix may be different for different $u_j$. For an $u_j$, the amount to cyclically shift the $u_j$ may also be different for different layers. A column-to-layer look-up-table (LUT) may receive the column number corresponding to $u_j$ to return the layer number of all the non-zero circulants for the column. Each layer number may be used to look up the cyclic shift amount for the layer. Each layer number may also be used as the location of the SA_BUF to store the partial syndrome for that layer. In one or more embodiments, the column-to-layer LUT may also return the cyclic shift amount for the layer.

Figure 8:
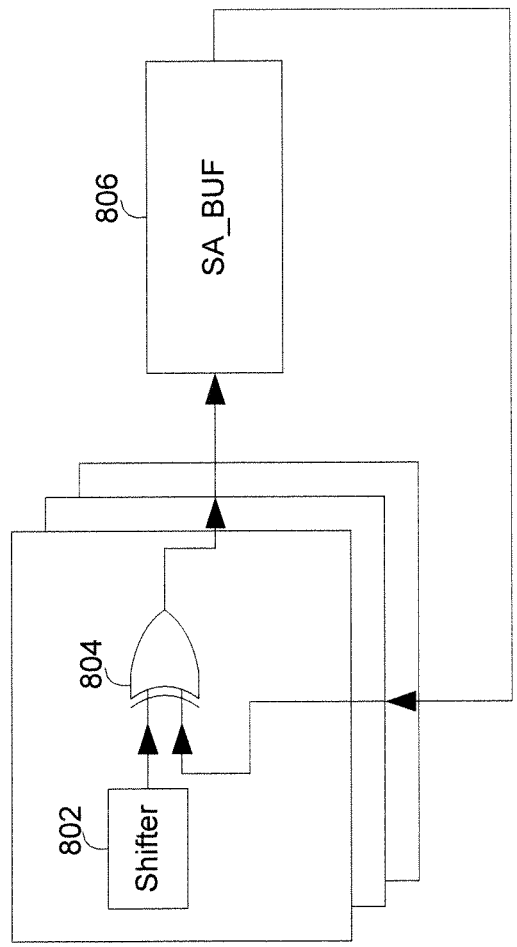
FIG. 8 shows a block diagram of a syndrome accumulator with the number of cyclic shifters equal to the column weight of a parity check matrix according to one embodiment of the present invention.

FIG. 8 shows a block diagram of a syndrome accumulator with the number of cyclic shifters equal to the column weight $w_c$ of a parity check matrix according to one embodiment of the present invention. The column weight $w_c$ and the number of cyclic shifters 802 are 3 in the embodiment. Each cyclic shifter 802 cyclically shifts $u_j^1, u_j^2 \ldots u_j^p$ of an $u_j$ sub-vector by an amount determined by the p×p circulant sub-matrix of a layer. Each output of cyclic shifter 802 is modulo-2 summed by an XOR gate 804 with the partial syndromes of the layer stored in SA_BUF 806. The partial syndromes for all three layers may be read in parallel from SA_BUF 806. The updated partial syndromes for all three layers from XOR gate 804 may also be written in parallel to SA_BUF 806.

SA_BUF 806 may be implemented as flip-flops, single port memories, multi-port memories, or others. If implemented as flip-flops, there may be (m·p) flip-flops, representing m layers with each layer having p check nodes. For the example of the three cyclic shifters 802, (3·p) of the flips-flops may be selected to update in a single clock cycle the partial syndromes for the three layers corresponding to the $u_j$ sub-vector. If implemented as a multi-port memory, SA_BUF 806 may be configured as m memory words of p bits each. The multiple ports of the memory may allow access to the m layers of the partial syndromes in a memory clock cycle. However, when m is more than a small number or when (m·p) is large, it may be more efficient to implement SA_BUF 806 as single-port memories. There may be $w_c$ single-port memories of m words by p bits. For an $u_j$ sub-vector, each single-port memory may update the partial syndrome for one of the $w_c$ layers. Because the layer number of the $w_c$ layers are different for different $u_j$, the partial syndromes for a layer may be distributed across all $w_c$ single-port memories. A final syndrome accumulation may modulo-2 sum the partial syndromes for the same layer distributed across the $w_c$ single-port memories before outputting the syndromes to the final syndrome check module for monitoring.

Figure 9:
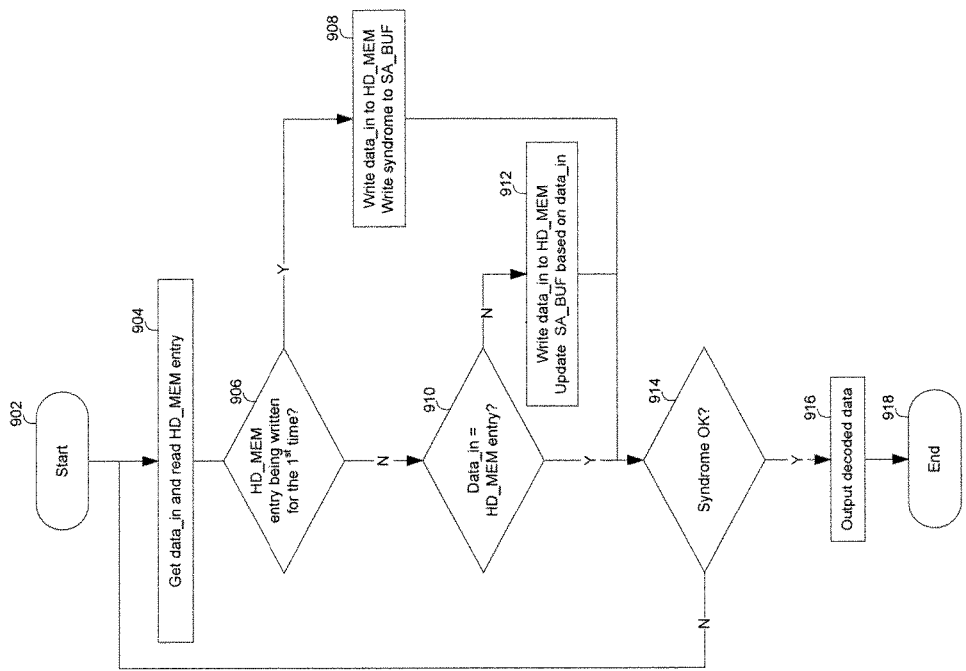
FIG. 9 shows a flow chart of the processing of the parity check unit according to one embodiment of the present invention.

FIG. 9 shows a flow chart of the processing of the parity check unit according to one embodiment of the present invention. Syndrome accumulator control module 502 of FIG. 5 may implement the flow chart to control the operation of syndrome calculation, update, and accumulation. Syndrome accumulator control module 502 may implement the flow chart using hardware, software running on a processor, or a combination of hardware and software known to one skilled in the art.

Starting in 902, the parity check unit receives decoded hard decisions for p bits of the codeword as data_in from message processing unit 103. For a QC-LDPC code, p may be the size of the circulant sub-matrix. In 904, the parity check unit evaluates the data_in and the state of HD_MEM 504. Data_in may be $u_j$ of the codeword received in the order $u_1, u_2 \ldots u_c$. In other embodiments, $u_j$ may be received out of order if message processing unit 103 iteratively decodes the received codeword out of order. HD_MEM 504 may store $u_j$ of the codeword received. In 906, the parity check unit determines if $u_j$ of data_in is the first time that the hard decisions for $u_j$ are received, or alternatively if $u_j$ is an update of the hard decisions from the iterative decoding process. In 908, if $u_j$ is received for the first time, $u_j$ is written to HD_MEM 504 and the partial syndromes for the layers in the column of the parity check matrix corresponding to $u_j$ are written into SA_BUF 508. Because this is the first partial syndromes for the layers, the matrix multiplication between elements in the corresponding column of the parity check matrix and $u_j$ may be written to SA_BUF 508 without modulo-2 summing with the existing data of SA_BUF 508.

In 910, if $u_j$ is an update of the hard decisions from the iterative decoding process, the parity check unit determines if $u_j$ is the same as the existing $u_j$ in HD_MEM 504. If they are not the same, one or more of the hard decisions of $u_j$ stored in HD_MEM 504 have been flipped. In 912, the parity check unit writes the updated $u_j$ to HD_MEM 504. The parity check unit also updates the partial syndromes in SA_BUF 508 for the layers in the column of the parity check matrix corresponding to the flipped bits. For example, for QC-LDPC code, the parity check unit may flip the partial syndromes in SA_BUF 508 for the layers corresponding to the flipped hard decisions of $u_j$.

In 910, if the parity check unit determines that $u_j$ of data_in is the same as the existing $u_j$ in HD_MEM 504, the iterative decoding process has not flipped any hard decisions in $u_j$. The $u_j$ in HD_MEM 504 and the partial syndromes corresponding to the $u_j$ in SA_BUF 508 do not need to be updated. In 914, the parity check unit determines if the partial syndromes for all the layers are zero. The parity check unit may wait until the hard decision for all $u_j$ in $u_1$, $u_2 \ldots u_c$, have been received at least once before declaring that the syndromes for all the layers are zero. If at least one partial syndrome is non-zero, the decoded codeword fails the parity check for all check nodes and the parity check unit returns to 904 to wait for the next iteratively decoded $u_j$ in data_in. On the other hand, if all the partial syndromes are zero, a valid codeword has been detected. In 916, the parity check unit outputs HD_MEM 504 as the decoded codeword and terminates the decoding in 918. In one or more embodiments, if all the partial syndromes are still not zero after a timeout interval, the parity check unit may abort the decoding. Because the partial syndromes are updated only for the layers corresponding to the flipped code bits, the exit time to terminate the decoding is fast from the time a valid codeword enters the parity check unit.

Figure 10:
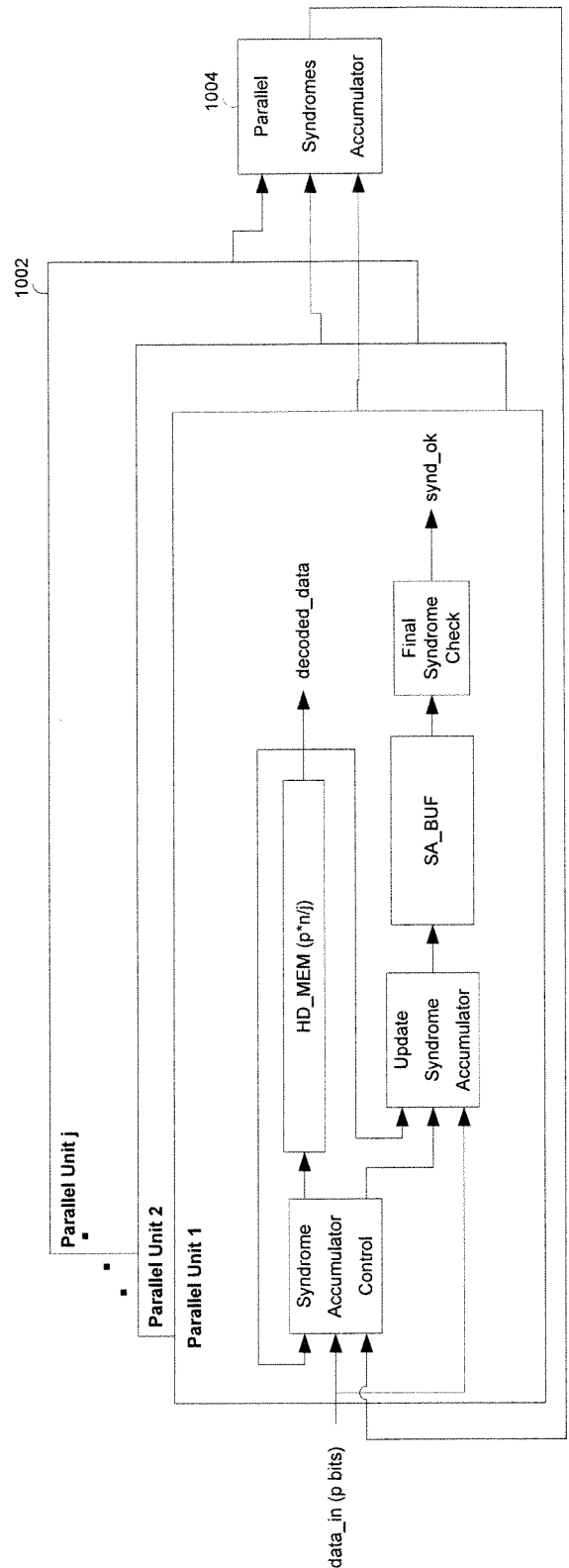
FIG. 10 shows a block diagram of parallel parity check units for syndrome accumulation of multiple groups of hard decision according to one embodiment of the present invention.

FIG. 10 shows a block diagram of parallel parity check units for syndrome accumulation of multiple groups of hard decision according to one embodiment of the present invention. To increase the decoding throughput, parity check matrix H may be partitioned. Parallel message processing units 103 may estimate the most likely codeword in an iterative decoding process using the parity check equations of the partitioned H matrix. Each message processing unit 103 may generate an $u_j$ for one partition. Thus, the parallel message processing units 103 may generate multiple $u_j$ in parallel corresponding to the number of partitions. Parallel parity check units 1002 may support the multiple $u_j$ received from the parallel message processing units 103.

An example of a QC-LDPC parity check matrix H with three layers and used to decode a codeword having four sub-vectors is shown below:

$$\begin{bmatrix} y_1 \\ y_2 \\ y_3 \end{bmatrix} = \begin{bmatrix} H_{1,1} & H_{1,2} & H_{1,3} & H_{1,4} \\ H_{2,1} & H_{2,2} & H_{2,3} & H_{2,4} \\ H_{3,1} & H_{3,2} & H_{3,3} & H_{3,4} \end{bmatrix} \cdot \begin{bmatrix} v_1 \\ v_2 \\ v_3 \\ v_4 \end{bmatrix} \quad \text{(Eq. 7)}$$

For two parallel message processing units 103 and two parallel parity check units 1002, the H matrix may be partitioned into two partitions along the dotted line to yield:

$$\begin{bmatrix} y_1 \\ y_2 \\ y_3 \end{bmatrix} = \begin{bmatrix} H_{1,1} & H_{1,2} \\ H_{2,1} & H_{2,2} \\ H_{3,1} & H_{3,2} \end{bmatrix} \cdot \begin{bmatrix} v_1 \\ v_2 \end{bmatrix} + \begin{bmatrix} H_{1,3} & H_{1,4} \\ H_{2,3} & H_{2,4} \\ H_{3,3} & H_{3,4} \end{bmatrix} \cdot \begin{bmatrix} v_3 \\ v_4 \end{bmatrix} \quad \text{(Eq. 8)}$$

In one or more embodiments, the H matrix may be partitioned such that columns having more dependencies are grouped in the same partition. One message processing unit 103 and one parity check unit 1002 will operate on the first partition to accumulate the partial syndromes for the three layers of the first partition:

$$\begin{bmatrix} H_{1,1} & H_{1,2} \\ H_{2,1} & H_{2,2} \\ H_{3,1} & H_{3,2} \end{bmatrix} \cdot \begin{bmatrix} v_1 \\ v_2 \end{bmatrix} \quad \text{(Eq. 9)}$$

A second message processing unit 103 and a second parity check unit 1002 will operate on the second partition to accumulate the partial syndromes for the three layers of the second partition:

$$\begin{bmatrix} H_{1,3} & H_{1,4} \\ H_{2,3} & H_{2,4} \\ H_{3,3} & H_{3,4} \end{bmatrix} \cdot \begin{bmatrix} v_3 \\ v_4 \end{bmatrix} \quad \text{(Eq. 10)}$$

The partial syndromes for the three layers from the two partitions are summed by a parallel syndrome accumulator 1004. When the H matrix is a binary matrix, parallel syndrome accumulator 1004 may be implemented using exclusive-or gates.

The cost for the parallel parity check units 1002 is an increase in the SA_BUF size by the number of partitions. In the example of the two partitions of the H matrix, the size of SA_BUF may be (m·p·2) when implemented in flip-flops. When a regular H matrix has a column weight of $w_c$, and the SA_BUF is implemented using single port memories, the size of SA_BUF may be (m·p·$w_c$·number of partitions). The parallel message processing units may process the H matrix to generate hard decision for the sub-vectors of the codeword out of order. The parallel parity check units 1002 inherently support out of order processing of the received sub-vectors.

In the parity check unit of the layered LDPC decoder discussed, there may be a fixed pipeline delay from the time the hard decisions of $u_j$ enter HD_MEM to the valid syndrome output from the final syndrome check. During the pipeline delay when the decoder determines if there is a valid syndrome, HD_MEM may be updated with additional hard decisions of $u_j$. For example, under certain conditions, the decoder may converge only briefly (e.g., 1 clock cycle), and may diverge for some time (e.g., tens or hundreds of clock cycles) before converging again. Thus, when a valid syndrome is declared during the initial window of convergence, the codeword stored in HD_MEM may be different from the codeword that gives rise to the valid syndrome. To prevent the parity check unit from outputting an erroneous codeword, the hard decision of HD_MEM may be buffered.

Figure 11:
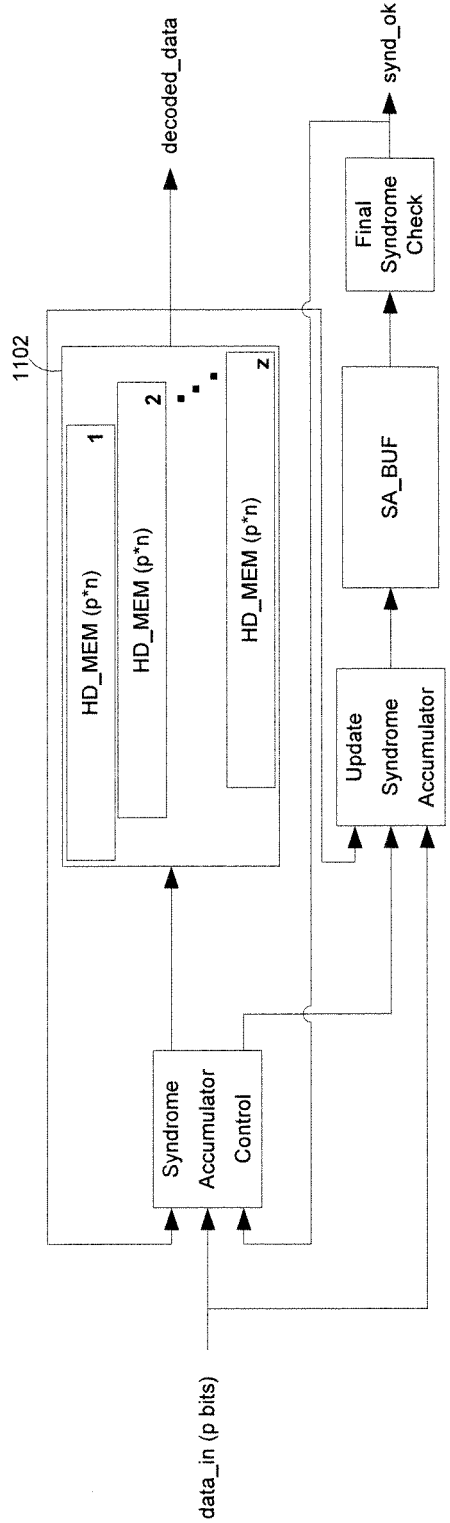
FIG. 11 shows a block diagram of a parity check unit using additional hard decision memories to synchronize syndrome check and decoded data according to one embodiment of the present invention.

FIG. 11 shows a block diagram of a parity check unit using additional hard decision memories to synchronize the syndrome check and the decoded data according to one embodiment of the present invention. A cascaded chain of HD_MEM 1102 stores the hard decisions received during the pipeline delay. The number of copies of HD_MEM 1102 may be the number of clocks of the pipeline delay, denoted by z. When a valid syndrome is declared from the final syndrome check, the valid codeword may be taken from the last stage of HD_MEM 1102. Thus, even when the hard decisions change during the pipeline delay, the codeword that gives rise to the valid syndrome is saved for output as the decoded codeword. In one or more embodiments, instead of saving multiple copies of entire content of HD_MEM 1102, only the hard decisions in HD_MEM 1102 whose values are flipped by newly received $u_j$ during the pipeline delay are saved. Memories used to save flipped hard decisions that are older than the pipeline delay may be recycled.

Because memories are expensive in area and power, it may be desirable to avoid the use of additional HD_MEM to store the hard decisions. An acceptable trade-off may be to keep a single HD_MEM at a cost of a small probability that the decoder may miss a brief window of convergence. In return, the syndrome accumulator control 502 of the parity check unit may be modified with little cost in area and power to ensure that the parity check unit outputs a valid codeword when a valid syndrome is detected after the pipeline delay.

Figure 12:
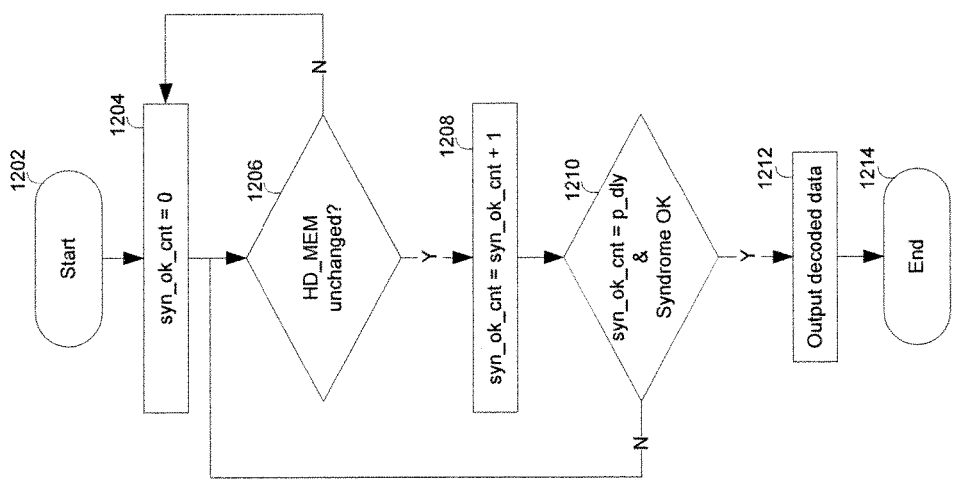
FIG. 12 shows a flow chart of the processing of the syndrome accumulator control of the parity check unit to synchronize syndrome check and decoded data according to one embodiment of the present invention.

FIG. 12 shows a flow chart of the processing of the syndrome accumulator control 502 of the parity check unit to synchronize the syndrome check and the decoded data according to one embodiment of the present invention. Starting in 1202, it is assumed that the parity check unit has received decoded hard decision for all (n·p) code bits of the codeword at least once from message processing unit 103. In 1204, syndrome accumulator control 502 resets a syndrome-ok count to zero. In 1206, syndrome accumulator control 502 determines if the content of HD_MEM 504 has changed after receiving additional hard decisions of $u_j$. If HD_MEM 504 has changed because the iterative decoding process has flipped at least one hard decision of the existing $u_j$ in HD_MEM 504, syndrome accumulator control 502 returns control to 1204 to reset the syndrome-ok count.

On the other hand, if HD_MEM 504 has not changed, syndrome accumulator control 502 increments the syndrome-ok count in 1208. For example, if the new $u_j$ is the same as the existing $u_j$ in HD_MEM 504, it means the iterative decoding process has not flipped any hard decisions in $u_j$. The existing $u_j$ in HD_MEM 504 is not updated and the content of HD_MEM 504 remains the same. Syndrome accumulator control 502 increments the syndrome-ok count to indicate that HD_MEM 504 has not changed for an additional clock. In 1210, syndrome accumulator control 502 determines if the syndrome-ok count is equal to the pipeline delay and if final syndrome check 510 declares a valid syndrome. This is the condition when HD_MEM 504 remains unchanged for the entire duration of the pipeline delay it takes for the parity check unit to generate the final syndrome check based on the codeword in HD_MEM 504. If the condition is true, in 1212, the parity check unit outputs the decoded codeword in HD_MEM 504 and the decoding is terminated in 1214.

On the other hand, if the syndrome-ok count is not equal to the pipeline delay or if there is not a valid syndrome, syndrome accumulator control 502 returns control to 1206 to receive additional hard decisions $u_j$. For example, when convergence happens for a brief period less than the pipeline delay, HD_MEM 504 may have changed during the pipeline delay. In this case, even though there is a valid syndrome check, the codeword giving rise to the valid syndrome has been overwritten in HD_MEM 504. The syndrome-ok count is less than the pipeline delay and the condition in 1210 is false. Thus, the parity check unit does not output the erroneous codeword in HD_MEM 504. The steps of FIG. 12 ensure that only valid codewords are output, at a cost of a slight increase in the decoding time when a brief window of convergence is missed.

The descriptions set forth above are provided to illustrate one or more embodiments of the present invention and are not intended to limit the scope of the present invention. Although the invention is described in details with reference to the embodiments, a person skilled in the art may obtain other embodiments of the invention through modification of the disclosed embodiment or replacement of equivalent parts. It is understood that any modification, replacement of equivalent parts and improvement are within the scope of the present invention and do not depart from the spirit and principle of the invention as hereinafter claimed.

What is claimed is:

1. A method for decoding a low density parity check code (LDPC code), comprising:
   receiving by a processor a received sub-vector of a decoded codeword;
   determining if any part of the received sub-vector is different from a corresponding saved sub-vector;
   if the received sub-vector is different from the saved sub-vector, saving the received sub-vector as the saved sub-vector, and updating, based on the difference, partial syndromes of one or more layers of check nodes, wherein the one or more layers have non-zero elements in a column of a code matrix corresponding to the part of the received sub-vector that has changed, wherein the partial syndromes of each layer of the check nodes are accumulated across a plurality of sub-vectors of the decoded codeword, and wherein the one or more layers whose partial syndromes are accumulated are different for different sub-vectors; and
   checking the partial syndromes of all layers of the check nodes.

2. The method of claim 1, further comprising:
   if there is no saved sub-vector, saving the received sub-vector as the saved sub-vector, and updating the partial syndromes of one or more layers of check nodes, wherein the one or more layers have non-zero elements in the column of the code matrix corresponding to the received sub-vector.

3. The method of claim 2, further comprising repeating said receiving, determining, saving, and updating for a the plurality of sub-vectors of the codeword to accumulate the partial syndromes of each layer of the check nodes.

4. The method of claim 3, wherein said checking the partial syndromes further comprises:
   verifying that there is a saved sub-vector for all sub-vectors of the codeword; and
   outputting all the saved sub-vectors as a validly decoded codeword when the partial syndromes for all layers of the check nodes are zero.

5. The method of claim 3, wherein said checking the partial syndromes further comprises:
   verifying that there is a saved sub-vector for all sub-vectors of the codeword;
   verifying that all the saved sub-vectors have not changed for a period of time equivalent to the time it takes to check the partial syndromes for all layers of the check node after receiving a sub-vector of the decoded codeword; and
   outputting all the saved sub-vectors as a validly decoded codeword when the partial syndromes for all layers of the check nodes are zero.

6. The method of claim 1, wherein said updating, based on the difference between the received sub-vector and the saved sub-vector, comprises:
   detecting a flipped bit between the received sub-vector and the saved sub-vector; and
   flipping the partial syndromes of one or more layers of check nodes, wherein the one or more layers have non-zero elements in a column of the code matrix corresponding to the flipped bit,
   and wherein said saving the received sub-vector comprises saving the flipped bit to update a corresponding bit of the saved sub-vector.

7. The method of claim 6, wherein said saving the received sub-vector further comprises saving the saved sub-vector to prevent the saved sub-vector from being overwritten by the flipped bit of the received sub-vector from the time of receiving the sub-vector to when said checking of the partial syndromes of all layers of the check nodes is completed.

8. The method of claim 1, wherein the LDPC code is a quasi-cyclic LDPC (QC-LDPC) comprising sub-matrix circulants of size p×p, and wherein the received sub-vector of the codeword has p hard decisions.

9. The method of claim 1, further comprising:
receiving in parallel by the processor a plurality of received sub-vectors of the decoded codeword;
performing said determining, saving, and updating for the plurality of received sub-vectors in parallel to generate in parallel a plurality of partial syndromes for each of the one or more layers of the check nodes corresponding to the plurality of received sub-vectors; and
accumulating the plurality of partial syndromes for each of the one or more layers of the check nodes corresponding to the plurality of received sub-vectors before checking the partial syndrome for all layers of the check nodes.

10. An apparatus, comprising:
a hard decision memory configured to store a plurality of saved sub-vectors of a decoded codeword of a low density parity check code (LDPC code);
a partial syndrome buffer configured to store partial syndromes for a plurality of layers of check nodes of the LDPC code;
a processor configured to:
receive a received sub-vector of the codeword;
determine if any part of the received sub-vector is different from the corresponding saved sub-vector in the hard decision memory; and
if the received sub-vector is different from the saved sub-vector, save the received sub-vector as the saved sub-vector in the hard decision memory, and update, based on the difference, the partial syndromes of one or more layers of the check nodes in the partial syndrome buffer, wherein the one or more layers have non-zero elements in a column of a code matrix corresponding to the part of the received sub-vector that has changed, wherein the partial syndromes of each layer of the check nodes are accumulated across a plurality of sub-vectors of the decoded codeword, and wherein the one or more layers whose partial syndromes are accumulated are different for different sub-vectors; and
check the partial syndromes of all layers of the check nodes in the partial syndrome buffer.

11. The apparatus of claim 10, wherein the processor is further configured to, if there is no saved sub-vector:
save the received sub-vector as the saved sub-vector in the hard decision memory, and
update the partial syndromes of one or more layers of the checked nodes in the partial syndrome buffer, wherein the one or more layers have non-zero elements in the column of the code matrix corresponding to the received sub-vector.

12. The apparatus of claim 11, wherein the processor is further configured to:
successively receive the plurality of received sub-vectors;
determine if any part of each of the received sub-vectors is different from the corresponding saved sub-vector in the hard decision memory; and
if each of the received sub-vectors is different from the saved sub-vector, save the received sub-vector as the saved sub-vector in the hard decision memory, and update, based on the difference, the partial syndromes of one or more layers of the check nodes in the partial syndrome buffer, wherein the one or more layers have non-zero elements in a column of a code matrix corresponding to the part of the received sub-vector that has changed, wherein the partial syndromes of each layer of the check nodes are accumulated across the plurality of sub-vectors of the decoded codeword.

13. The apparatus of claim 12, wherein the processor is further configured to:
verify that there is a saved sub-vector for all sub-vectors of the codeword in the hard decision memory; and
output all the saved sub-vector as a validly decoded codeword when the partial syndromes of all layers of the check nodes in the partial syndrome buffer are zero.

14. The apparatus of claim 12, wherein the processor is further configured to:
verify that there is a saved sub-vector for all sub-vectors of the codeword in the hard decision memory;
verify that all the saved sub-vectors have not changed for a period of time equivalent to the time it takes for the processor to check the partial syndromes for all layers of the check node after receiving a sub-vector of the decoded codeword;
output all the saved sub-vector as a validly decoded codeword when the partial syndromes of all layers of the check nodes in the partial syndrome buffer are zero.

15. The apparatus of claim 10, wherein the processor is further configured to:
detect a flipped bit between the received sub-vector and the saved sub-vector;
flip the partial syndromes of one or more layers of the check nodes in the partial syndrome buffer, wherein the one or more layers have non-zero elements in a column of the code matrix corresponding to the flipped bit; and
save the flipped bit to update a corresponding bit of the saved sub-vector in the hard decision memory.

16. The apparatus of claim 15, wherein the hard decision memory further comprises a buffer to save the saved sub-vector to prevent the saved sub-vector from being overwritten by the flipped bit of the received sub-vector from the time the sub-vector is received to the time the processor completes checking the partial syndromes of all layers of the check nodes in the partial syndrome buffer.

17. The apparatus of claim 10, wherein the LDPC code is a quasi-cyclic LDPC (QC-LDPC) comprising sub-matrix circulants of size p×p, and wherein the received sub-vector of the codeword has p hard decisions.

18. The apparatus of claim 17, wherein the partial syndrome buffer comprises:
one or more cyclic shifters configured to shift the received sub-vector by one or more non-zero sub-matrix circulants in the column of the code matrix corresponding to the received sub-vector;
a plurality of exclusive-or gates to accumulate the output from the one or more cyclic shifters; and
one or more storage elements to store the accumulated output from the one or more cyclic shifters as the partial syndromes for the plurality of layers.

19. The apparatus of claim 10, wherein the processor is further configured to:
receive in parallel a plurality of received sub-vectors of the decoded codeword;
determine if each of the received sub-vectors is different from the corresponding saved sub-vector in the hard decision memory; and if each of the received sub-vectors is different from the corresponding saved sub-vector, save the received sub-vector as the saved sub-vector in the hard decision memory, and update in parallel, based on the difference, the partial syndromes of one or more layers of the check nodes in the partial syndrome buffer for the plurality of received sub-vectors, wherein the one or more layers have non-zero elements in a column of a code matrix corresponding to each of the received sub-vectors; and accumulate the plurality of partial syndromes for each of the one or more layers of the check nodes in the partial syndrome buffer.

20. The apparatus of claim 10, wherein the partial syndrome buffer comprises a plurality of memories whose number is equal to a maximum column weight of the code matrix, wherein the plurality of memories accumulate in parallel the partial syndromes of all layers of the check nodes, and wherein the partial syndromes for a layer are distributed across the plurality of memories.

* * * * *

UNITED STATES PATENT AND TRADEMARK OFFICE
CERTIFICATE OF CORRECTION

PATENT NO. : 9,692,450 B2  
APPLICATION NO. : 14/708507  
DATED : June 27, 2017  
INVENTOR(S) : Mohammad Athar Khalil et al.

Page 1 of 1

It is certified that error appears in the above-identified patent and that said Letters Patent is hereby corrected as shown below:

In the Claims

Column 14, Line 32, delete "a"

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*